(12) United States Patent
Aonuma

(10) Patent No.: US 9,515,292 B2
(45) Date of Patent: Dec. 6, 2016

(54) MANUFACTURING METHOD OF ORGANIC EL ELEMENT

(71) Applicant: JOLED INC., Tokyo (JP)

(72) Inventor: Masaki Aonuma, Fukuoka (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/009,367

(22) PCT Filed: Nov. 6, 2012

(86) PCT No.: PCT/JP2012/007115
§ 371 (c)(1),
(2) Date: Oct. 2, 2013

(87) PCT Pub. No.: WO2013/099084
PCT Pub. Date: Jul. 4, 2013

(65) Prior Publication Data
US 2014/0080241 A1 Mar. 20, 2014

(30) Foreign Application Priority Data
Dec. 28, 2011 (JP) .................................. 2011-289192

(51) Int. Cl.
*H01L 51/56* (2006.01)
*H01L 51/52* (2006.01)
*C23C 14/35* (2006.01)
*H05B 33/28* (2006.01)
*C23C 14/08* (2006.01)

(52) U.S. Cl.
CPC ............ *H01L 51/56* (2013.01); *C23C 14/086* (2013.01); *C23C 14/35* (2013.01); *H01L 51/5221* (2013.01); *H01L 51/5234* (2013.01); *H05B 33/28* (2013.01)

(58) Field of Classification Search
None
See application file for complete search history.

(56) References Cited

U.S. PATENT DOCUMENTS

| 6,187,457 B1 * | 2/2001 | Arai .................... H01L 51/5221 257/100 |
| 7,348,724 B2 | 3/2008 | Lee |
| 8,808,877 B2 | 8/2014 | Terao |
| 2002/0121859 A1 * | 9/2002 | Hayashi et al. .............. 313/504 |
| 2005/0116628 A1 | 6/2005 | Lee |
| 2009/0146161 A1 | 6/2009 | Miki et al. |

(Continued)

FOREIGN PATENT DOCUMENTS

| CN | 1625315 A | 6/2005 |
| CN | 102113148 A | 6/2011 |

(Continued)

OTHER PUBLICATIONS

Jung et al. Influence of dc magnetron sputtering parameters on surface morphology of indium tin oxide thin films. 2004. Applied Surface Science 221 (2004) pp. 136-142.*

(Continued)

*Primary Examiner* — Selim Ahmed
(74) *Attorney, Agent, or Firm* — Greenblum & Bernstein, P.L.C.

(57) ABSTRACT

A method of manufacturing an organic EL element having a pair of electrodes and an organic functional layer disposed therebetween, the pair of electrodes consisting of an upper electrode and a lower electrode, comprising: forming the upper electrode on the organic functional layer by a magnetron sputtering method with a film-forming power density no less than 4.5 W/cm² and no greater than 9.0 W/cm².

7 Claims, 16 Drawing Sheets

(56) References Cited

U.S. PATENT DOCUMENTS

| | | |
|---|---|---|
| 2011/0186843 A1 | 8/2011 | Kim et al. |
| 2011/0297917 A1* | 12/2011 | Terao .................... 257/40 |
| 2012/0132935 A1* | 5/2012 | Isobe et al. ............. 257/88 |

FOREIGN PATENT DOCUMENTS

| | | |
|---|---|---|
| JP | 2002-161352 | 6/2002 |
| JP | 2002-161352 A | 6/2002 |
| JP | 2005-166671 | 6/2005 |
| JP | 2005-248211 | 9/2005 |
| JP | 2006-059657 | 3/2006 |
| JP | 2007-039712 | 2/2007 |
| JP | 2007-095338 | 4/2007 |
| JP | 2010-225293 | 10/2010 |
| JP | 2011-040173 | 2/2011 |
| TW | 200814369 | 3/2008 |
| TW | 201128706 | 8/2011 |
| WO | WO 2011021280 A1 * | 2/2011 |

OTHER PUBLICATIONS

Yamamoto et al., Low-Damage Indium Tin Oxide Formation on Organic Layers Using Unique Cylindrical Sputtering Module and Application in Transparent Organic Light-Emitting Diodes, 2006, Japanese J. of App. Phys., vol. 45, No. 7, pp. L213-L216).*

International Search Report, mailed Dec. 4, 2012, in corresponding International Application No. PCT/JP2012/007115.

Chinese Office Action, mailed Sep. 6, 2015, from the State Intellectual Property Office (SIPO) of the People's Republic of China, for the corresponding Chinese Patent Application No. 201280017672.2 9 (together with partial English language translation).

Chinese Office Action including Search Report, mailed Apr. 27, 2016, from the State Intellectual Property Office (SIPO) of the People's Republic of China, for the corresponding Chinese Patent Application No. 201280017672.2 (together with English language translation of Search Report).

Kenyan Dong, et al., "Production and properties of ITO transparent conductive film glass", Japanese Journal of Applied Physics, vol. 42, pp. 306-309, published Feb. 10, 2006, including English language Abstract.

Taiwan Office Action, including Search Report and English language translation of Search Report, dated May 11, 2016, in Taiwanese Patent Application No. 101142191.

Kenyan Dong, et al., "Production and properties of ITO transparent conductive film glass", Journal of Functional Materials, vol. 42, pp. 306-309, published Feb. 10, 2006, including English language Abstract.

* cited by examiner

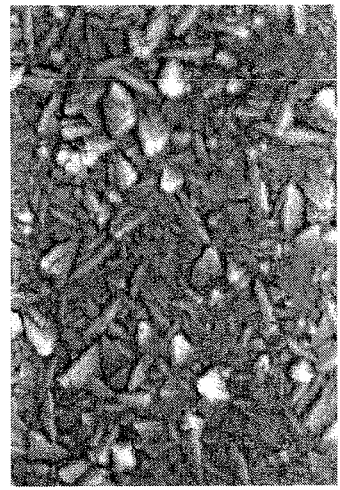
FIG. 10C Frequency 250→350kHz
FIG. 10F Pressure 0.6→0.2Pa
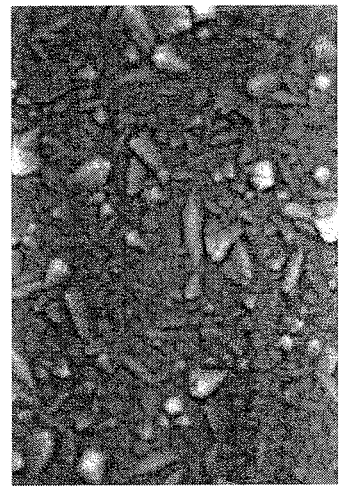
FIG. 10B DUTY 73%→60%
FIG. 10E Film-forming power 2.5kw→1.25kw
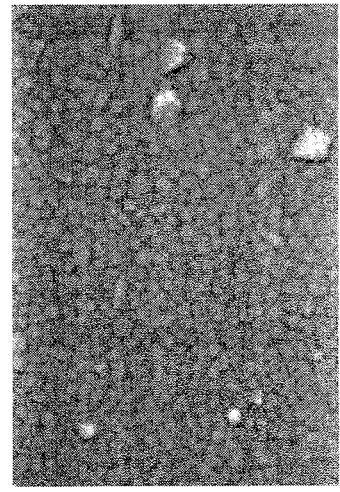
FIG. 10A Normal
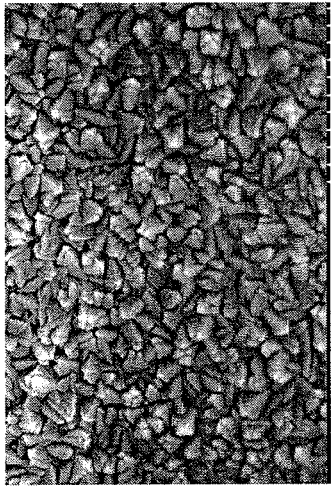
FIG. 10D O2 flow rate 1.5→3.0sccm

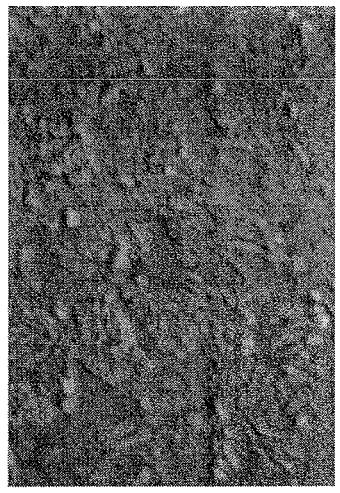
FIG. 11C Frequency 250→100kHz
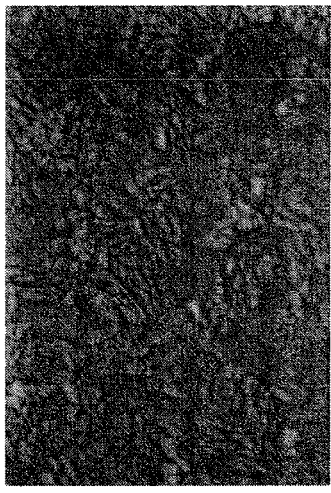
FIG. 11F Pressure 0.6→0.5Pa
FIG. 11B DUTY 73%→60%
FIG. 11E Film-forming power 5.4kw→2.7kw
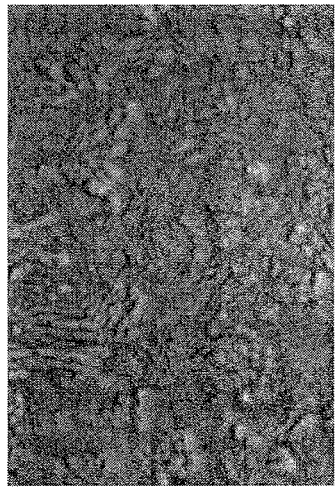
FIG. 11A Normal
FIG. 11D O2 flow rate 10→15sccm

MANUFACTURING METHOD OF ORGANIC EL ELEMENT

TECHNICAL FIELD

The present invention relates to a technology for manufacturing an organic EL element, and in particular to a technology for forming an electrode of an organic EL element.

An organic EL element is manufactured by layering a lower electrode, one or more organic functional layers, and an upper electrode in this order on a substrate.

In the manufacturing of such an organic EL element, electrodes are formed by applying energy to a target member by using heat, plasma, etc., and depositing particles of an electrode material contained in the target member on an underlayer on which the electrode is to be formed.

Since the energy of heat, plasma, etc., is applied to the target member, organic functional layers as the underlayer might be damaged by the effect of heat, plasma, etc., in the process of forming the upper electrode on the organic functional layers. The damage of the organic functional layers leads to a deterioration in characteristics of the organic EL element, such as the driving efficiency and life span.

Therefore, considering the deterioration in characteristics of the organic EL element such as the driving efficiency and the life span caused by the damage to the organic functional layers as the underlayer, a vapor deposition method or a low energy sputtering method is employed in the process of forming the upper electrode (see Patent Literature 1, Patent Literature 2). For example, in Patent Literature 2, the upper electrode is formed by a sputtering method with a film-forming power density of 1 W/cm$^2$.

CITATION LIST

Patent Literature

[Patent Literature 1]
Japanese Patent Application Publication No. 2007-95338
[Patent Literature 2]
Japanese Patent Application Publication No. 2007-39712

SUMMARY OF INVENTION

Technical Problem

Conventionally, an organic EL element is manufactured by forming an electrode on the organic functional layers by the vapor deposition method or the low energy sputtering method. However, such an organic EL element does not provide excellent characteristics in terms of the driving efficiency and the life span.

The present invention has been achieved in view of the above problem, and an aim thereof is to provide a manufacturing method of an organic EL element having excellent characteristics in terms of the driving efficiency and the life span.

Solution to Problem

In order to achieve the above aim, one aspect of the present invention provides a method of manufacturing an organic EL element having a pair of electrodes and an organic functional layer disposed therebetween, the pair of electrodes consisting of an upper electrode and a lower electrode, comprising: forming the upper electrode on the organic functional layer by a magnetron sputtering method with a film-forming power density no less than 4.5 W/cm$^2$ and no greater than 9.0 W/cm$^2$.

Advantageous Effects of Invention

Since an electrode is formed on organic functional layers by a magnetron sputtering method with a film-forming power density no less than 4.5 W/cm$^2$ and no greater than 9.0 W/cm$^2$, which is a high energy process, adhesion between the organic functional layers and the electrode is strong. Therefore, it is possible to manufacture an organic EL element having excellent characteristics in terms of the driving efficiency and the life span.

BRIEF DESCRIPTION OF DRAWINGS

FIGS. 10A-10F show SEM images of ITO films formed by a facing target sputtering method.

FIGS. 11A-11F show SEM images of ITO films formed by a magnetron sputtering method.

DESCRIPTION OF EMBODIMENTS

<Outline of Aspects of the Present Invention>

One aspect of the present invention provides a method of manufacturing an organic EL element having a pair of electrodes and an organic functional layer disposed therebetween, the pair of electrodes consisting of an upper electrode and a lower electrode, comprising: forming the upper electrode on the organic functional layer by a magnetron sputtering method with a film-forming power density no less than 4.5 W/cm$^2$ and no greater than 9.0 W/cm$^2$.

In this aspect of the method of manufacturing the organic EL element pertaining to the present invention, an atmospheric gas pressure during the formation of the upper electrode is no less than 0.4 Pa and no greater than 1.6 Pa.

In this aspect of the method of manufacturing the organic EL element pertaining to the present invention, an ion current density per unit dynamic rate during the formation of the upper electrode is no less than 0.2 mA/cm$^2$ and no greater than 0.4 mA/cm$^2$.

In this aspect of the method of manufacturing the organic EL element pertaining to the present invention, the upper electrode is formed of transparent conductive material.

In this aspect of the method of manufacturing the organic EL element pertaining to the present invention, the upper electrode is formed of indium tin oxide.

In this aspect of the method of manufacturing the organic EL element pertaining to the present invention, the upper electrode is a cathode, and the lower electrode is an anode.

In this aspect of the method of manufacturing the organic EL element pertaining to the present invention, the organic functional layer is composed of a plurality of layers including an electron transport layer, and the cathode is formed on the electron transport layer.

<Embodiments>

(Embodiment 1)

[Structure of Organic EL Element]

Figure 1:
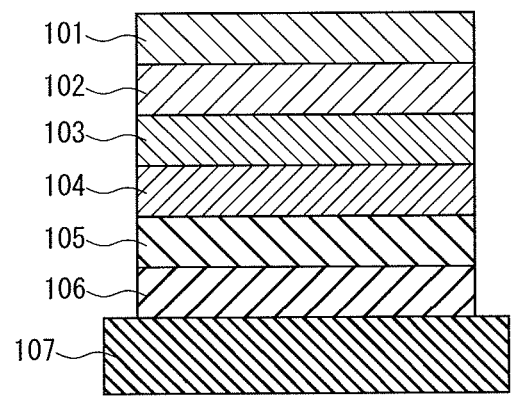
FIG. 1 is a cross-sectional view showing an example of the structure of an organic EL element 100.

First, description is made on the structure of an organic EL element pertaining to Embodiment 1. FIG. 1 is a cross-sectional view showing an example of the structure of an organic EL element 100 pertaining to Embodiment 1. As shown in FIG. 1, the organic EL element 100 includes a cathode 101, an electron transport layer 102, a light-emitting layer 103, a hole transport layer 104, a hole injection layer 105, an anode 106, and a substrate 107. The following describes each component.

<Cathode>

The cathode 101 injects electrons to the electron transport layer 102. The cathode 101 is made of ITO (indium tin oxide), IZO (indium zinc oxide), Ag (silver), Al (aluminum), silver-palladium-copper alloy, silver-rubidium-gold alloy, MoCr (molybdenum-chrome alloy), NiCr (nickel-chrome alloy), or the like.

In a top emission type organic EL element that emits light from a surface closer to the cathode, light transmissive material such as ITO (indium tin oxide) and IZO (indium zinc oxide) is used.

Note that an electron injection layer may be disposed between the cathode 101 and the electron transport layer 102. The electron injection layer promotes injection of electrons from the cathode 101 to the electron transport layer 102.

<Electron Transport Layer>

The electron transport layer 102 transports electrons injected from the cathode 101 to the light-emitting layer 103. The electron transport layer 102 is made of barium, phthalocyanine, lithium fluoride, etc.

<Light-Emitting Layer>

The light-emitting layer 103 is a layer that emits light by recombination of carriers (holes and electrons). The light-emitting layer 103 is made of an oxinoid compound, perylene compound, coumarin compound, etc.

<Hole Transport Layer>

The hole transport layer 104 transports holes injected from the anode 106 to the light-emitting layer 103. The hole transport layer 104 is made of a triazole derivative, an oxadiazole derivative, etc.

<Hole Injection Layer>

The hole injection layer 105 promotes injection of holes from the anode 106 to the hole transport layer 104. The hole injection layer 105 is made of metal oxide, metal nitride, or metal oxynitride such as MoOx (molybdenum oxide), WOx (tungsten oxide) and MoxWyOz (molybdenum tungsten oxide).

<Anode>

The anode 106 injects holes to the hole injection layer 105. The anode 106 is made of Ag (silver), Al (aluminum), silver-palladium-copper alloy, silver-rubidium-gold alloy, MoCr (molybdenum-chrome alloy), NiCr (nickel-chrome alloy), ITO (indium tin oxide), IZO (indium zinc oxide), or the like.

In a bottom emission type organic EL element that emits light from a surface closer to the substrate, light transmissive material such as ITO (indium tin oxide) and IZO (indium zinc oxide) is used to form the anode 106.

In a top emission type organic EL element that emits light from a surface closer to the cathode, light-reflective material is used to form the anode 106.

Note that in a top emission type organic EL element, a reflective electrode may be disposed between the anode 106 and the substrate 107.

<Substrate>

The substrate 107 is a base member for an organic EL element. An organic EL element is manufactured by sequentially layering the anode, the organic functional layers and the cathode on the substrate 107. The substrate 107 is made of one of insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

<Other>

While not shown in FIG. 1, a passivation layer is disposed on the cathode 101 in order to prevent the organic functional layers from deteriorating in reaction to moisture and air. In a top emission type organic EL element, the passivation layer is made of light transmissive material such as SiN (silicon nitride) and SiON (silicon oxynitride), for example.

This concludes the description of the structure of the organic EL element pertaining to Embodiment 1.

[Manufacturing Method of Organic EL Element]

Figure 2:
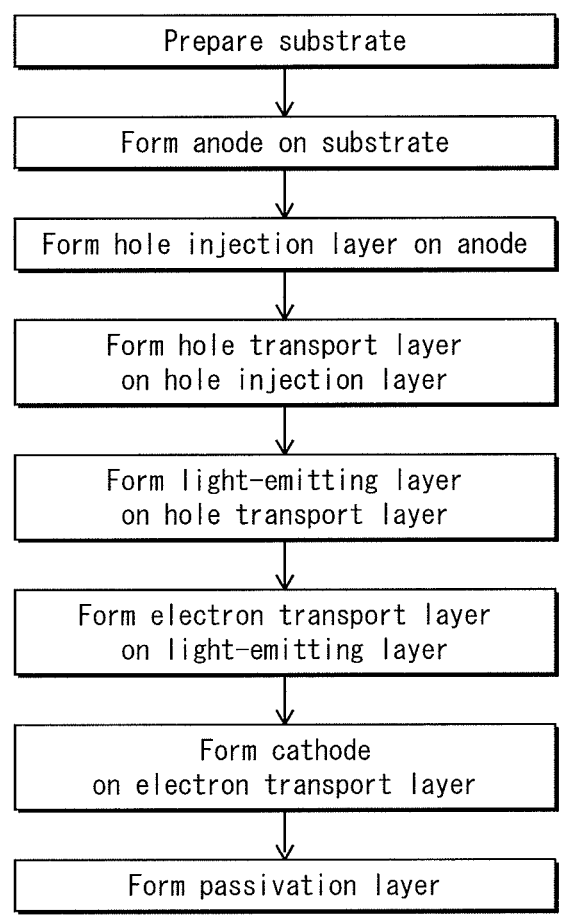
FIG. 2 is a flowchart showing a manufacturing process of an organic EL element.

Next, description is made on a manufacturing method of an organic EL element pertaining to Embodiment 1. FIG. 2 is a flowchart showing a manufacturing process of the organic EL element pertaining to Embodiment 1.

As shown in FIG. 2, the substrate 107 is prepared as a base member for the organic EL element, and the anode 106 is formed on the substrate 107. The anode 106 is formed by the vapor deposition method or the sputtering method.

Next, a plurality of organic functional layers are formed on the anode 106.

To be specific, the hole injection layer 105 is first formed on the anode 106. After formation of the hole injection layer 105, the hole transport layer 104 is formed on the hole injection layer 105. After formation of the hole transport layer 104, the light-emitting layer 103 is formed on the hole transport layer 104. After formation of the light-emitting layer 103, the electron transport layer 102 is formed on the light-emitting layer 103.

These organic functional layers are formed by the vapor deposition method or a coating method using an inkjet apparatus.

After formation of the organic functional layers, the cathode 101 is formed on the electron transport layer 102. The details on the manufacturing process of the cathode 101 are provided below.

As described above, the organic EL element is manufactured by sequentially forming the anode, organic functional layers and cathode on the substrate 107.

[Details on Manufacturing Process of Cathode]

Next, the details on the manufacturing process of the cathode are provided below. The cathode 101 is formed on the electron transport layer 102 by the magnetron sputtering method.

Figure 3:
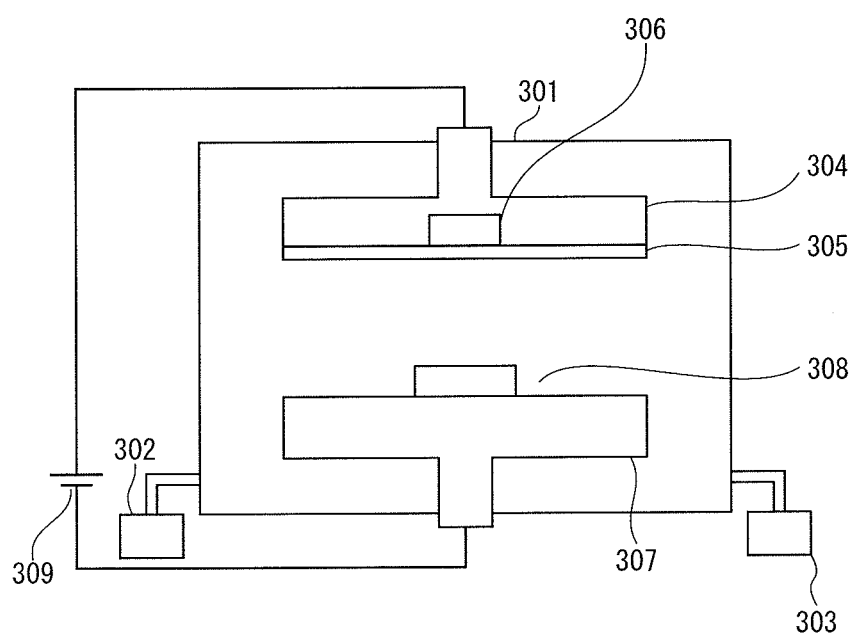
FIG. 3 shows the structure of a magnetron sputtering device 300.

FIG. 3 shows the structure of a magnetron sputtering device 300. As shown in FIG. 3, the magnetron sputtering device 300 includes a sputtering chamber 301, a gas supply system 302, an exhaust system 303, a backing plate 304, a target 305, a magnet 306, a mount 307, a film-forming substrate 308, and a power source 309.

The sputtering chamber 301 included in the magnetron sputtering device 300 is a chamber within which sputtering is performed.

The sputtering chamber 301 is connected to the gas supply system 302 and the exhaust system 303. The gas supply system 302 supplies a sputtering gas, and the exhaust system 303 reduces pressure in the sputtering chamber 301 to a predetermined pressure. The sputtering gas is an inert gas such as argon (Ar).

The mount 307 in the sputtering chamber 301 is provided with the film-forming substrate 308 on which film is to be formed. The backing plate 304 in the sputtering chamber 301 is provided with the plate-like target 305 that is film-forming member. On the rear surface of the target 305, the magnet 306 is disposed.

The power source 309 applies voltage to the target 305. Note that in the example shown in FIG. 3, the power source 309 is a DC power source, but may be an AC power source or an AC/DC hybrid power source.

First, the exhaust system 303 evacuates the sputtering chamber 301. Next, the gas supply system 302 supplies the sputtering chamber 301 with a sputtering gas. Then, the power source 309 applies voltage to the target 305. Finally, a sputtering gas plasma is generated to sputter the main surface of the target 305.

The magnet 306 disposed on the rear surface of the target 305 produces the magnetic field parallel to the main surface of the target 305. High-density plasma can be generated near the target by forcing secondary electrons to move with cycloidal motion or trochoidal motion. These secondary electrons are expelled from the surface of the target when ions of the sputtering gas bombard the surface, and trapped by the Lorentz force generated by the magnetic field produced on the surface of the target 305.

In the manufacturing method of the organic EL element pertaining to the present embodiment, ITO (indium tin oxide) is used as material for the target, and a transparent cathode is formed on the electron transport layer by the magnetron sputtering method through a high energy process. To be specific, the transparent cathode is formed by the magnetron sputtering method with the film-forming power density no less than 4.5 W/cm$^2$ and no greater than 9.0 W/cm$^2$. Here, a film-forming power density represents a film-forming power per unit area of the target.

Considering the deterioration in characteristics of the organic EL element such as the driving efficiency and the life span caused by the damage to the organic functional layers as the underlayer, the vapor deposition method or the low energy sputtering method has been employed in the conventional process of forming the cathode.

In particular, considering the deterioration in characteristics of the organic EL element such as the driving efficiency and the life span caused by the damage to the organic functional layers as the underlayer, a high energy sputtering method has been avoided in a top emission type organic EL element whose cathode needs to be formed of light transmissive material such as ITO (indium tin oxide) and IZO (indium zinc oxide).

However, when the film is formed by the conventional vapor deposition method or the low energy sputtering method, energy of molecules or atoms adhering to the organic functional layers as the underlayer is low, and accordingly, adhesion between the upper electrode and the organic functional layers as the underlayer is low. Therefore, injection barrier of electrons or holes between the organic functional layers and the electrode is large, and the manufactured organic EL element does not provide satisfactory driving efficiency and life span.

The inventor evaluated the damage to the electron transport layer caused by forming the ITO film, for example, and considered the possibility of compensating the damage to the electron transport layer caused by forming the ITO film by the high energy sputtering method by increasing adhesion between the ITO electrode and the electron transport layer.

As a result, the inventor has discovered that it is possible to manufacture an organic EL element with high electron injection performance from the cathode to the organic functional layers, high efficiency and a longer life span by forming an ITO film by the magnetron sputtering method in which a large amount of ions enter the substrate, through a high energy process, to increase adhesion between the organic functional layers and the cathode.

The following describes the manufacturing method of the organic EL element pertaining to the present embodiment in more detail with reference to the results of the experiments conducted by the inventor.

First, the inventor formed ITO films on the electron transport layer by the plasma gun deposition method, the magnetron sputtering method, and the facing target sputtering method, and the ITO films were evaluated. To be specific, evaluations were conducted in terms of the diameter of grains, the work function of each ITO film, and a sheet resistance of each ITO film.

Here, the plasma gun deposition method is a method for forming a thin film by heating and evaporating deposition material with a plasma gun. The facing target sputtering method is a method for performing sputtering by arranging two targets in parallel to each other, disposing a magnet on the rear surface of each of the two targets, and producing a vertical magnetic field between the targets.

The film-forming electrical power (film-forming power) in the magnetron sputtering method is 5.4 kW, and the film-forming power in the facing target sputtering method is 2.5 kW. If converting the film-forming power to a film-forming power density representing film-forming power per unit area of the target, the film-forming power density of the magnetron sputtering method is 9.0 W/cm$^2$.

The atmospheric gas pressure applied in the magnetron sputtering method and the facing target sputtering method is 0.6 Pa, and the atmospheric gas pressure applied in the plasma deposition method is 0.7 Pa.

Figure 4A:
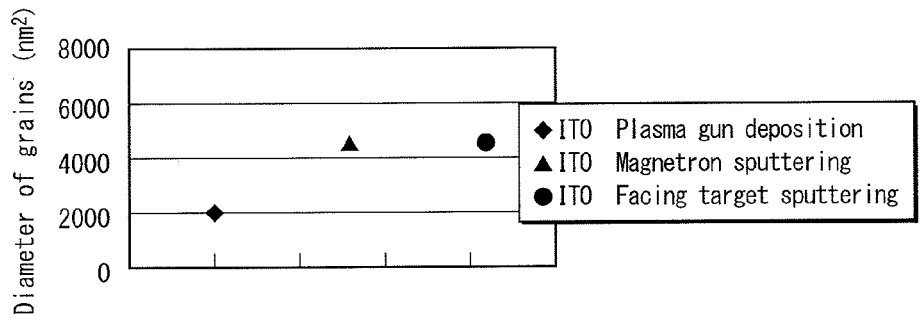
FIGS. 4A-4C show results of evaluation of ITO films formed by different methods.
Figure 4B:
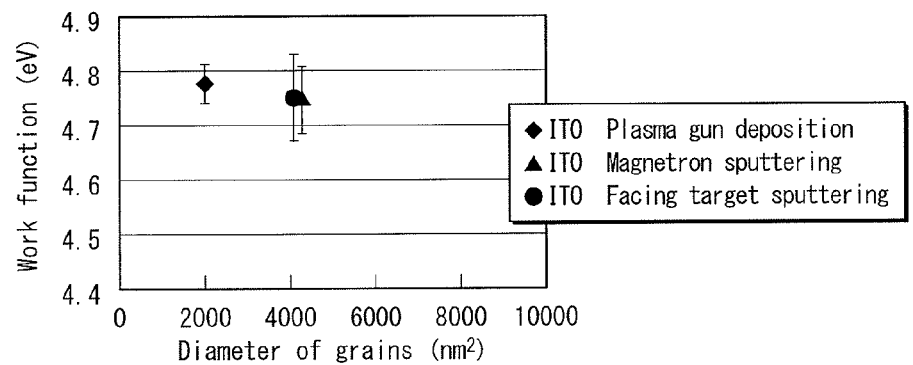
Figure 4C:
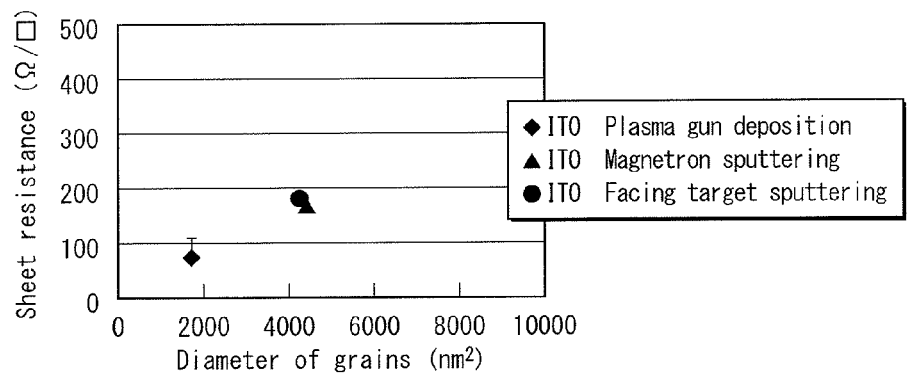

FIGS. 4A-4C show results of evaluation of ITO films formed by different methods. FIG. 4A shows the diameter of grains observed by Scanning Electron Microscope (SEM). FIG. 4B shows the work function of each ITO film. FIG. 4C shows the sheet resistance of each ITO film.

As shown in FIG. 4A, the diameter of grains in the ITO film formed by the magnetron sputtering method is similar to the diameter of grains in the ITO film formed by the facing target sputtering method. The diameter of grains in the ITO film formed by the plasma gun deposition method is smaller than the diameter of grains in the ITO films formed by the magnetron sputtering method and by the facing target sputtering method.

As shown in FIG. 4B, the work function of the ITO film formed by the plasma gun deposition method, the work function of the ITO film formed by the magnetron sputtering method, and the work function of the ITO film formed by the facing target sputtering method are similar.

As shown in FIG. 4C, the sheet resistance increases in proportion to the diameter of grains.

Thus, each ITO film was evaluated in terms of the diameter of grains, the work function of the ITO film, and the sheet resistance of the ITO film, and no clear difference was observed among the ITO films formed by the different methods in terms of the work function of the ITO films.

Figure 5A:
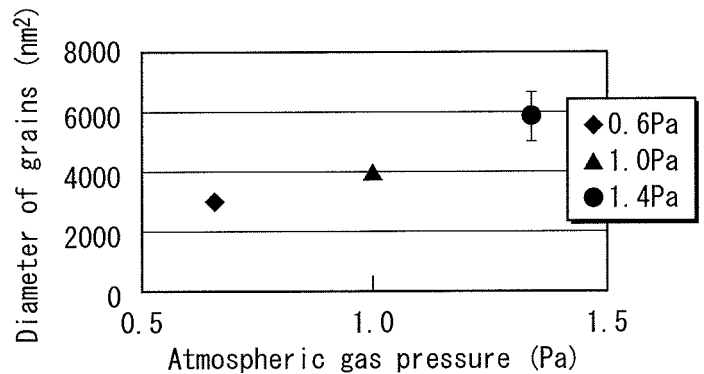
FIGS. 5A-5C show results of evaluation of ITO films formed under different conditions of atmospheric gas pressure.
Figure 5B:
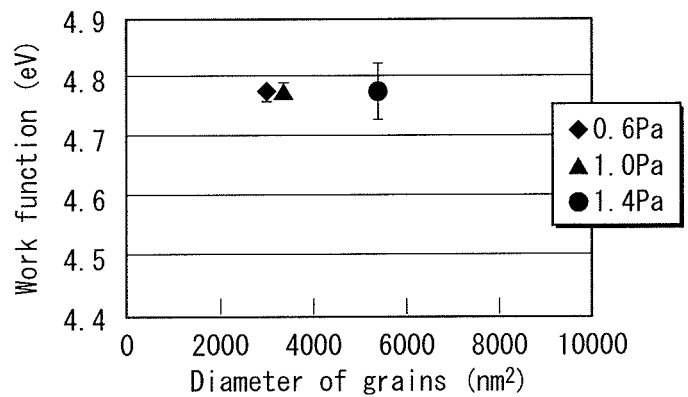
Figure 5C:
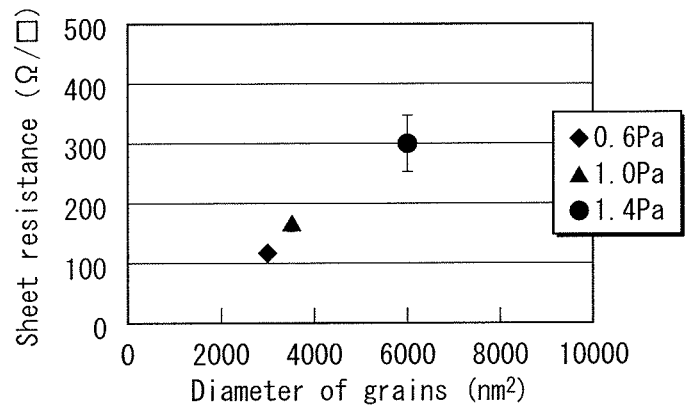

Further, the ITO films were formed by the magnetron sputtering method on the electron transport layer under different conditions of atmospheric gas pressure, and the ITO films were evaluated. FIGS. 5A-5C show results of evaluation of the ITO films formed under different conditions of atmospheric gas pressure. FIG. 5A shows the diameter of grains observed by SEM. FIG. 5B shows the work function of each ITO film. FIG. 5C shows the sheet resistance of each ITO film. Here, ITO films formed in cases where the atmospheric gas pressures are 0.6 Pa, 1.0 Pa, and 1.4 Pa are evaluated.

As shown in FIG. 5A, the diameter of grains in the ITO film increases in proportion to the atmospheric gas pressure.

As shown in FIG. 5B, the work functions of the ITO films formed in cases where the atmospheric gas pressures are 0.6 Pa, 1.0 Pa, and 1.4 Pa are similar.

As shown in FIG. 5C, the sheet resistance increases in proportion to the diameter of grains.

Thus, each of the ITO films formed by the magnetron sputtering method under different conditions of atmospheric gas pressure was evaluated in terms of the diameter of grains, the work function of the ITO film, and the sheet resistance of the ITO film, and no clear difference was observed among the ITO films formed under different conditions of atmospheric gas pressure in terms of the work function of the ITO films.

Further, the transmittance of each of the ITO films formed by the methods and under conditions shown in FIGS. 4A-5C was measured.

Figure 6A:
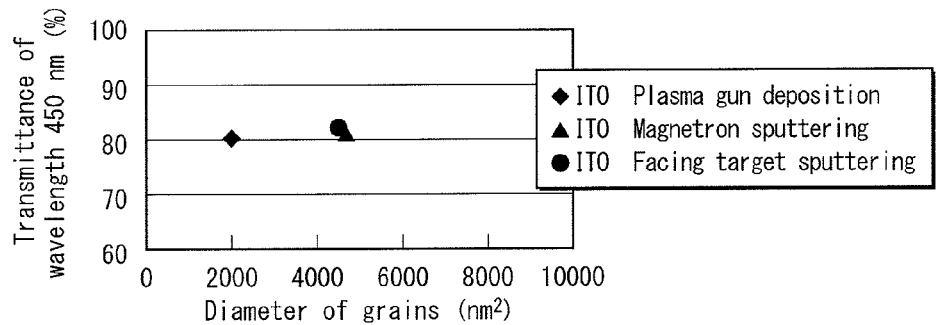
FIGS. 6A-6C show measurements of transmittance of ITO films formed by different methods.
Figure 6B:
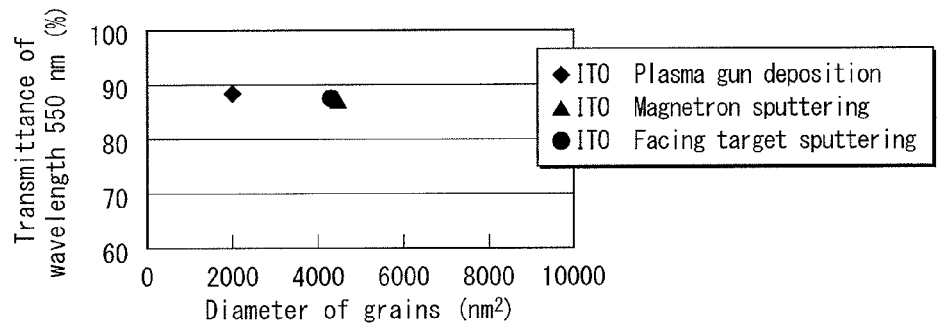
Figure 6C:
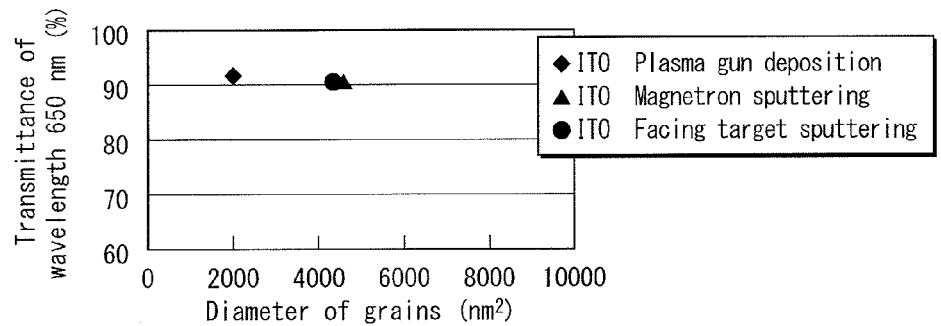

FIGS. 6A-6C show measurements of transmittance of ITO films formed by different methods. FIG. 6A shows the transmittance of light having a wavelength of 450 nm. FIG. 6B shows the transmittance of light having a wavelength of 550 nm. FIG. 6C shows the transmittance of light having a wavelength of 650 nm. The ITO films are formed by the plasma gun deposition method, the magnetron sputtering method, and the facing target sputtering method under the same conditions as those shown in FIGS. 4A-4C.

As shown in FIGS. 6A-6C, in every wavelength, the transmittance of the ITO films formed by different methods is the same.

Figure 7A:
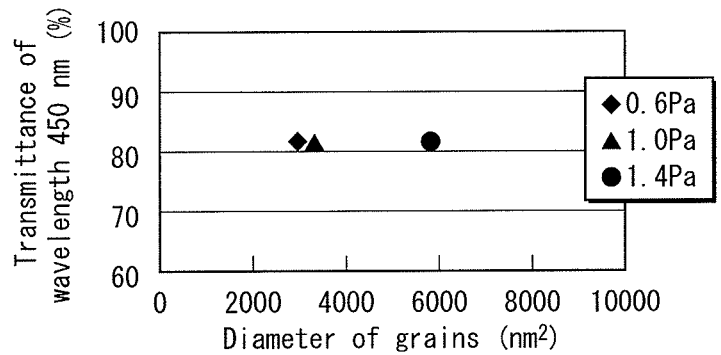
FIGS. 7A-7C show measurements of transmittance of ITO films formed under different conditions of atmospheric gas pressure.
Figure 7B:
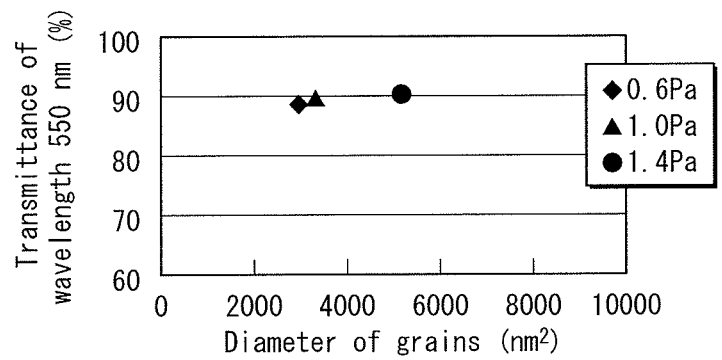
Figure 7C:
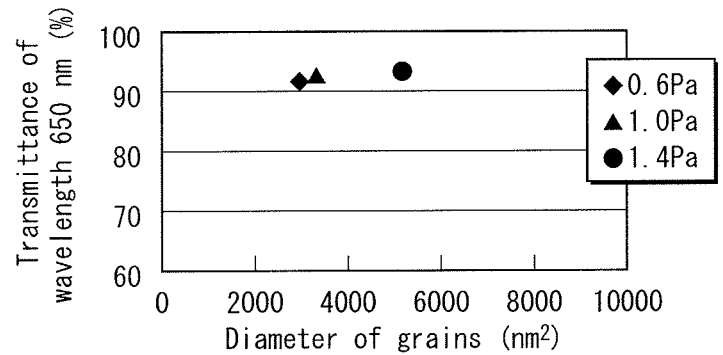

Further, FIGS. 7A-7C show measurements of transmittance of ITO films formed under different conditions of atmospheric gas pressure. FIG. 7A shows the transmittance of light having a wavelength of 450 nm. FIG. 7B shows the transmittance of light having a wavelength of 550 nm. FIG. 7C shows the transmittance of light having a wavelength of 650 nm. Here, transmittance of ITO films formed by the magnetron sputtering method under the same conditions shown in FIGS. 5A-5C in cases where the atmospheric gas pressures are 0.6 Pa, 1.0 Pa, and 1.4 Pa is evaluated.

As shown in FIGS. 7A-7C, in every wavelength, the transmittance of the ITO films formed under different conditions of atmospheric gas pressure is the same.

Further, damage to the organic functional layers as the underlayer, caused by forming an ITO film was evaluated by X-ray Photoelectron Spectroscopy (XPS). To be specific, in order to evaluate damage to the organic functional layers, an Alq3 (tris(8-hydroxyquinolinato)aluminium) film of 5 nm was formed by vapor deposition on a glass substrate, and ITO films of 35 nm were formed on the Alq3 film by the plasma gun deposition method, the magnetron sputtering method or the facing target sputtering method. Subsequently, the Alq3 film was removed from the glass substrate, and the interface of the Alq3 film and the ITO film was analyzed by XPS. Also, an aluminum (Al) film of 120 nm was formed by vapor deposition on the Alq3 film and the interface of the Alq3 film and the Al film was analyzed by XPS. For comparison, an Alq3 film without an ITO film was analyzed by XPS. Note that Alq3 is generally used as material of the electron transport layer of an organic EL element.

Figure 8A:
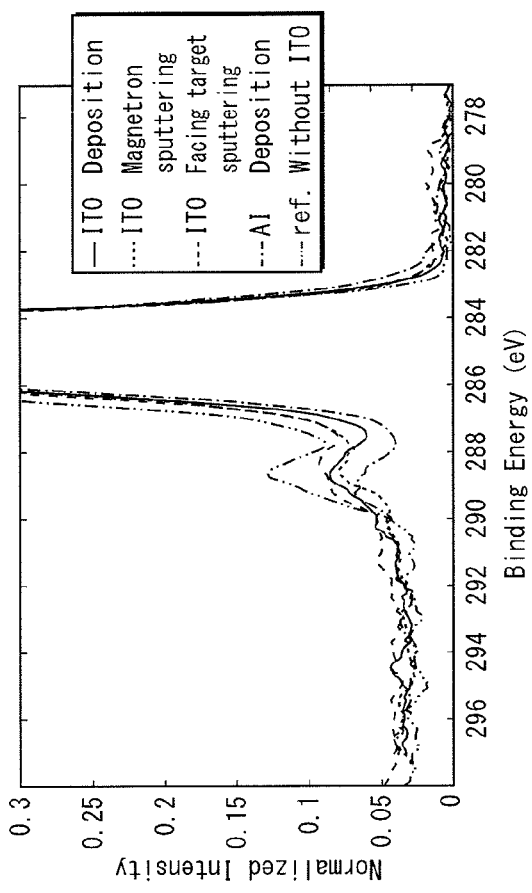
FIGS. 8A and 8B show results of XPS analysis of interfaces between Alq3 films and their respective ITO films.
Figure 8B:
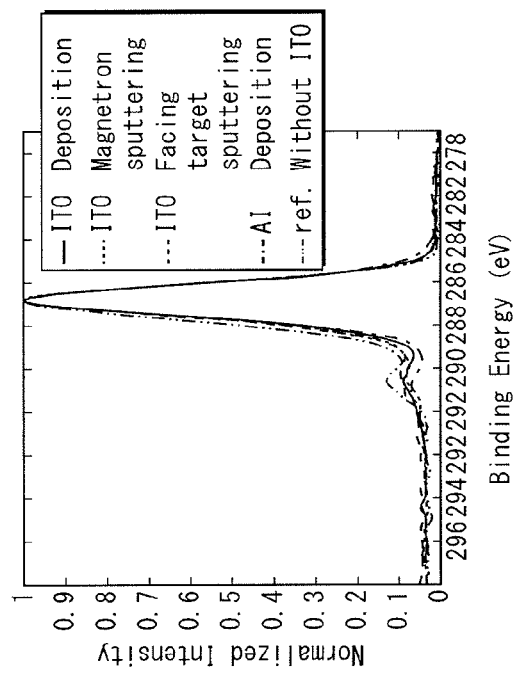

FIGS. 8A and 8B show results of XPS analysis of interfaces between Alq3 films and their respective ITO films. FIG. 8A shows a result of comparison of C1s spectra. FIG. 8B is an enlarged figure of the result of comparison of C1s spectra shown in FIG. 8A.

As shown in FIGS. 8A and 8B, similar reduction in the spectral peak was observed around the binding energy of 288-290 ev, for each of the ITO films formed by the plasma gun deposition method, the magnetron sputtering method and the facing target sputtering method. Such a reduction in the spectral peak is considered to be caused by the damage to the Alq3 film during the forming process of the ITO film, but no clear difference was observed among spectra due to different methods of forming ITO films.

Further, a ratio of components of the formed film was calculated by performing peak fitting on each spectrum. Samples are (1) an ITO film of 2 nm formed by the plasma gun deposition method on an Alq3 film, (2) an ITO film of 2 nm formed by the magnetron sputtering method on an Alq3 film, (3) an ITO film of 2 nm formed by the facing target sputtering method on an Alq3 film, (4) an Al (aluminum) film of 2 nm formed by vapor deposition on an Alq3 film, and (5) an Alq3 film without ITO film. The following shows the results.

TABLE 1

| Sample | C | N | O | Al | Si | In | Sn |
|---|---|---|---|---|---|---|---|
| Alq3 ITO deposition 2 nm | 48 | 2 | 30 | — | — | 18 | 2 |
| Alq3 ITO magnetron sputtering 2 nm | 47 | 2 | 29 | — | — | 16 | 6 |
| Alq3 ITO facing target sputtering 2 nm | 43 | 2 | 31 | — | — | 17 | 6 |
| Alq3 Al deposition 2 nm | 46 | 2 | 35 | 18 | — | — | — |
| Alq3 without ITO 2 nm (atom %) | 35 | 2 | 50 | 3 | 10 | — | — |

With reference to the above Table 1, no clear difference was observed among methods of forming ITO films in terms of a ratio of atoms.

The inventor focused on the fact that no clear differences were observed among the methods and conditions when the ITO films and organic functional layers were evaluated as shown in FIGS. 4A-8B and Table 1. Further, the inventor considered the possibility of manufacturing an organic EL element having excellent characteristics in terms of the driving efficiency and the life span by forming an ITO film by the high energy sputtering method, which has been conventionally avoided considering the deterioration in characteristics of the organic EL element such as the driving efficiency and the life span caused by the damage to the organic functional layers as the underlayer, so as to increase adhesion between the ITO layer and the organic functional layers.

Generally, an ITO film is formed by the magnetron sputtering method or the facing target sputtering method. Therefore, the inventor examined which of the magnetron sputtering method and the facing target sputtering method is better to form an electrode on the organic functional layers.

First, the inventor measured the ion current density indicating the amount of ion irradiation of a sputtering gas on the film-forming substrate, and ion energy of the sputtering gas, with the use of plasma diagnostics using a probe method, in cases of the magnetron sputtering method and the facing target sputtering method. Here, the plasma diagnostics using the probe method represents a method for measuring plasma characteristics by inserting a needle-like electrode (probe) in plasma, and measuring current flowing through the probe.

Figure 9:
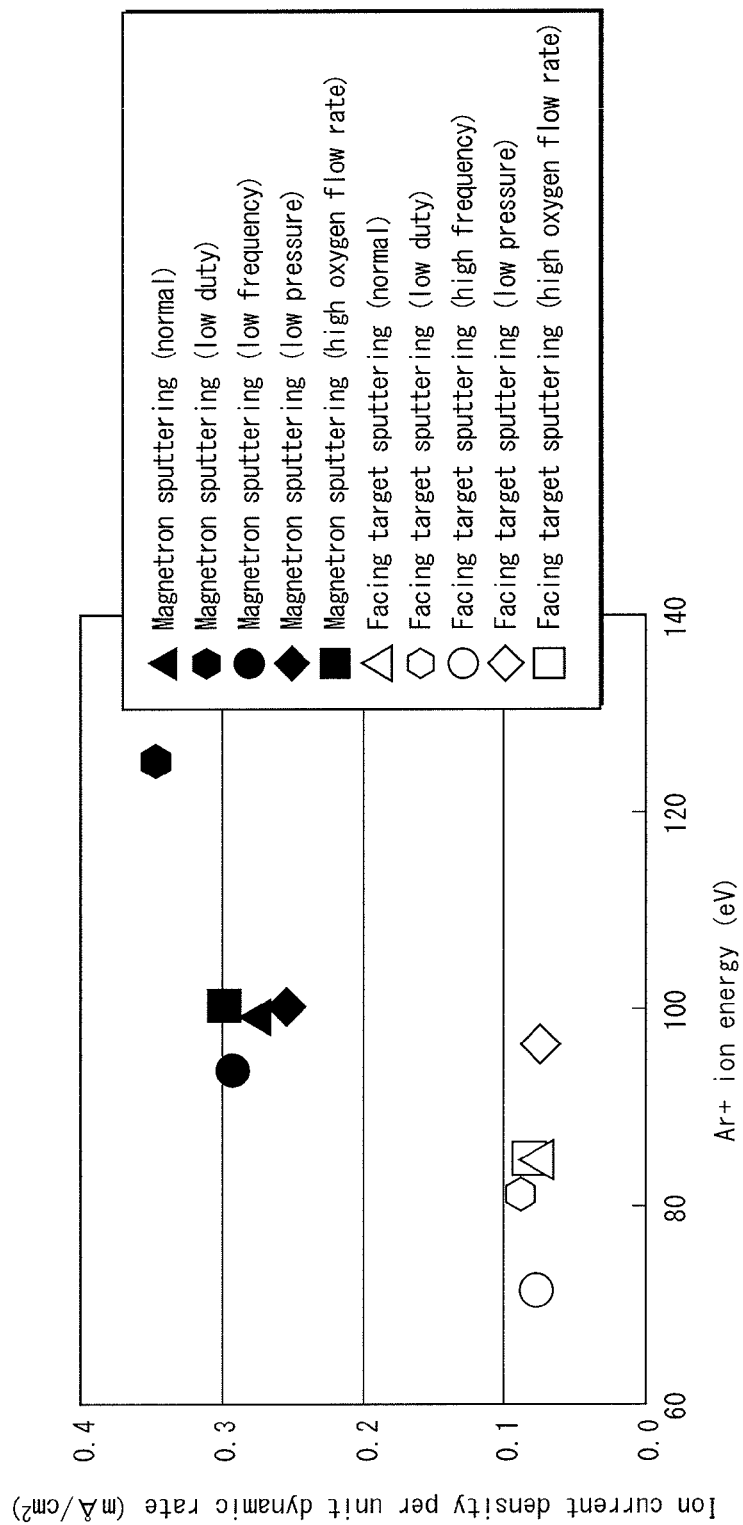
FIG. 9 shows measurements of plasma characteristics.

FIG. 9 shows measurements of plasma characteristics. The following table shows the measurement of plasma characteristics in detail.

TABLE 2

| method | process condition | dynamic rate (Åm/min.) | dynamic rate (nm · m/sec.) | Ar ion energy (eV) | O$_2$ ion energy (eV) | ion current value (mA/cm$^2$) | ion current density per unit rate |
|---|---|---|---|---|---|---|---|
| magnetron sputtering | normal | 911.92 | 1.519866667 | 99.2 | 133.26 | 0.42 | 0.27634 |
| | low duty | 901.1 | 1.501833333 | 125 | 201.73 | 0.53 | 0.35290 |
| | low frequency | 985.11 | 1.64185 | 93.8 | 124.48 | 0.48 | 0.29235 |
| | low pressure | 967.15 | 1.611916667 | 100.3 | 135.76 | 0.41 | 0.25436 |
| | high oxygen flow rate | 944.76 | 1.5746 | 100.4 | 132.09 | 0.47 | 0.29849 |
| facing target sputtering | normal | 79.16 | 0.131933333 | 84.61 | 124.19 | 0.01 | 0.07580 |
| | low duty | 68.15 | 0.113583333 | 81.39 | 134.47 | 0.01 | 0.08804 |
| | high frequency | 76.09 | 0.126816667 | 71.61 | 105.99 | 0.01 | 0.07885 |
| | low pressure | 81.22 | 0.135366667 | 96.39 | 141.28 | 0.01 | 0.07387 |
| | high oxygen flow rate | 75.55 | 0.125916667 | 84.87 | 124.78 | 0.01 | 0.07942 |

Here, plasma characteristics of the film-forming substrate are measured by inserting a probe into a position of the film-forming substrate. The horizontal axis represents collision energy of Ar ion (Ar$^+$ ion energy) against the film-forming substrate. The vertical axis represents ion current per unit dynamic rate. The ion current value represents a current value at which plasma flows into the probe. The ion current value per unit dynamic rate represented by the vertical axis in FIG. 9 indicates an amount of ions entering the film-forming substrate obtained by dividing the ion current value by dynamic rate (film forming speed when the film-forming substrate passes under the target at a transport speed of 1 m/min:Åm/min).

Detailed conditions for each method are shown below.

TABLE 3

| method | condition | distance between target and substrate [mm] | film-forming power [kW] | atmospheric gas pressure [Pa] | gas flow [sccm] | | | frequency [kHz] | duty ratio [%] |
|---|---|---|---|---|---|---|---|---|---|
| | | | | | Ar | O$_2$ | H$_2$0 | | |
| plasma gun deposition | normal | 800 | 30 | 0.7 | 300 | 35 | 5 | | |
| magnetron sputtering | normal | 80 | 5.4 | 0.6 | 200 | 10 | | 250 | 72.5 |
| | low duty | | | 0.6 | 200 | 10 | | 250 | 60 |
| | low frequency | | | 0.6 | 200 | 10 | | 100 | 73 |
| | low pressure | | | 0.5 | 100 | 6 | | 250 | 72.5 |
| | high oxygen flow rate | | | 0.6 | 200 | 15 | | 250 | 72.5 |
| facing target sputtering | normal | 120 | 2.5 | 0.6 | 200 | 1.5 | | 250 | 72.5 |
| | low duty | | | 0.6 | 200 | 1.5 | | 250 | 60 |
| | high frequency | | | 0.6 | 200 | 1.5 | | 350 | 72 |
| | low pressure | | | 0.2 | 100 | 2.3 | | 250 | 72.5 |
| | high oxygen flow rate | | | 0.6 | 200 | 3 | | 250 | 72.5 |

In the above Table 3, the film-forming power of the magnetron sputtering method is 5.4 kW, and the film-forming power of the facing target sputtering method is 2.5 kW. If converting the film-forming power to the film-forming power density representing the film-forming power per unit area of the target, the film-forming power density of the magnetron sputtering method is 9.0 W/cm$^2$.

The gas flow represents a flowing amount of gas supplied to the sputtering chamber. The frequency represents a pulse frequency of current applied to the target. The duty ratio represents a ratio of positive bias per pulse cycle.

As shown in FIG. 9, in every film-forming condition, the magnetron sputtering method has a greater ion current density per unit dynamic rate indicating an amount of ions entering the film-forming substrate than that of the facing target sputtering method. To be specific, the ion current density of the magnetron sputtering method per unit dynamic rate is no less than 0.2 mA/cm$^2$ and no greater than 0.4 mA/cm$^2$.

For example, when comparing the case of the facing target sputtering method at low pressure and the case of the magnetron sputtering method under the normal condition, Ar$^+$ ion energies are the same but the ion current densities per unit dynamic rate are three times different. In this case, energy accumulated on the film-forming substrate in the case of the magnetron sputtering method under the normal condition is three times as large as energy accumulated on the film-forming substrate in the case of the facing target sputtering method at low pressure.

When ions of a sputtering gas, i.e., Ar, enter the film-forming substrate, the ions give kinetic energy to sputtering atoms that have adhered to the film-forming substrate. It therefore could be possible that the sputtering atoms that have adhered are accumulated more closely to the organic functional layers, and that a dense thin film is formed.

According to the result of this experiment, in the manufacturing method of the organic EL element pertaining to the present embodiment, the ion current density per unit dynamic rate while forming the upper electrode is preferred to be no less than 0.2 mA/cm$^2$ and no greater than 0.4 mA/cm$^2$.

In the manufacturing method of the organic EL element pertaining to the present embodiment, the inventor focused on the influence the sputtering gas ions entering the film-forming substrate have on the adhesion between the ITO layer and the organic functional layers, and focused on the magnetron sputtering method having greater energy accumulated on the film-forming substrate than the facing target sputtering method.

Here, ITO films were formed by the facing target sputtering method or the magnetron sputtering method under different film-forming conditions, and surfaces of the ITO films were observed by Scanning Electron Microscope (SEM) to examine changes in the surfaces of the ITO films according to film-forming conditions.

FIGS. 10A-10F show SEM images of ITO films formed by the facing target sputtering method. The SEM images in FIGS. 10A, 10B, 10C, 10D and 10F show ITO films formed under the film-forming conditions shown in Table 2. The SEM image in FIG. 10E shows an ITO film formed under the normal film-forming condition shown in Table 2 with the film-forming power halved from 2.5 kw to 1.25 kw.

As shown in FIGS. 10A-10F, in the case of using the facing target sputtering method, particles losing substance were observed when the ITO films were formed under the film-forming conditions except for the normal condition.

FIGS. 11A-11F show SEM images of ITO films formed by the magnetron sputtering method. The SEM images in FIGS. 11A, 11B, 11C, 11D and 11F show ITO films formed under the film-forming conditions shown in Table 2. The SEM image in FIG. 11E shows an ITO film formed under the normal film-forming condition shown in Table 2 with the film-forming power halved from 5.4 kw to 2.7 kw.

As shown in FIGS. 11A-11F, in the case of using the magnetron sputtering method, substructure in which grains are connected to one another is observed in the ITO films formed under every condition, and it is clear that dense thin films are formed.

Also, the crystallinity of ITO films formed by the magnetron sputtering method and the facing target sputtering method was analyzed by X-ray diffraction analysis.

Figure 12:
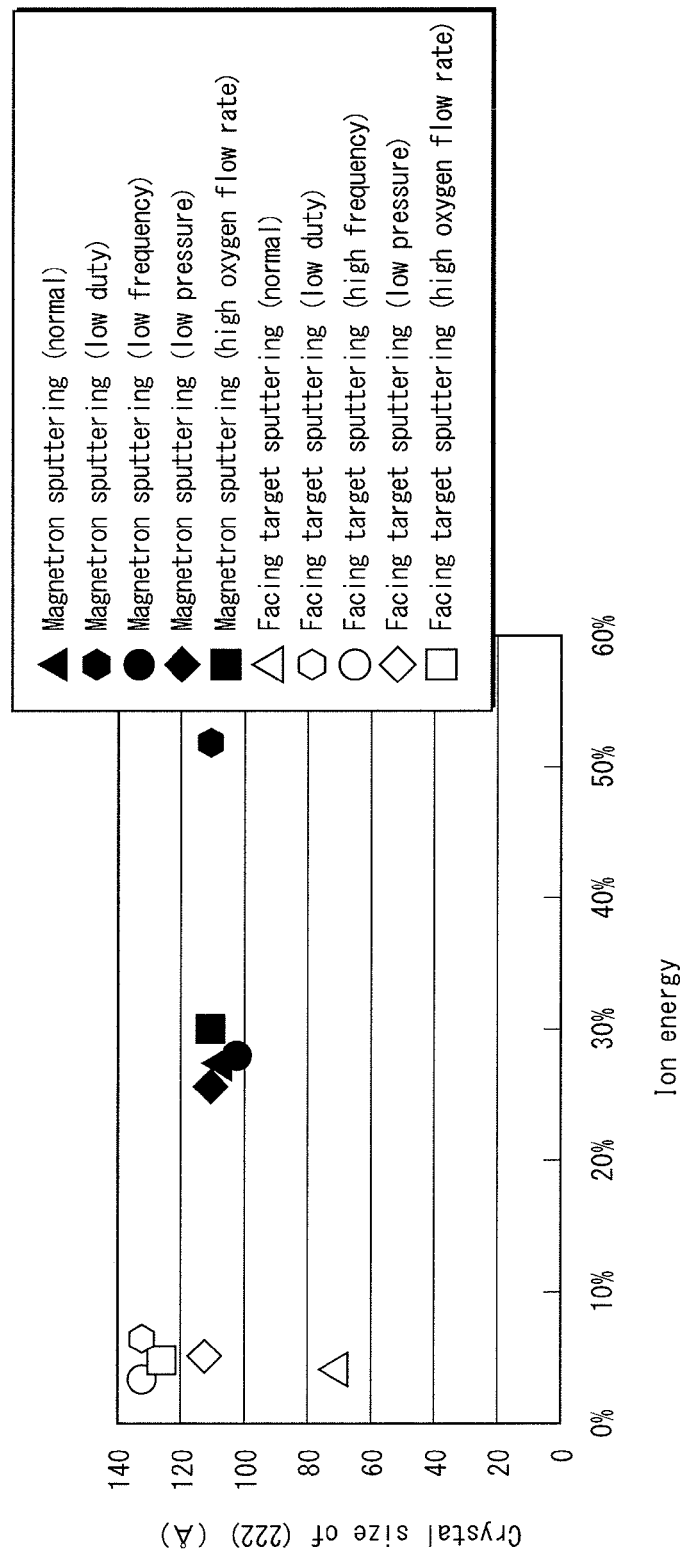
FIG. 12 shows measurements of the sizes of crystals of ITO films.

FIG. 12 shows measurements of the sizes of crystals of ITO films. Here, ITO films were formed by the same sputtering methods under the same film-forming conditions shown in FIG. 9, and the size of crystals were calculated from the full width at half-maximum (FWHM) of the (222) diffraction line by using the Scherer equation. The following shows the Scherer equation.

$$D = \frac{0.94\lambda}{\beta \cdot \cos\theta} \quad \text{[Math 1]}$$

In the above expression, D denotes the size of crystallite, $\lambda$ denotes the X-ray wavelength, $\beta$ denotes peak width, and $\theta$ denotes the Bragg angle of the diffraction line.

As shown in FIG. 12, the ITO films formed by the facing target sputtering method have various sizes of the crystallite according to the film-forming conditions, while the ITO films formed by the magnetron sputtering method have the similar size of the crystallite.

Figure 13:
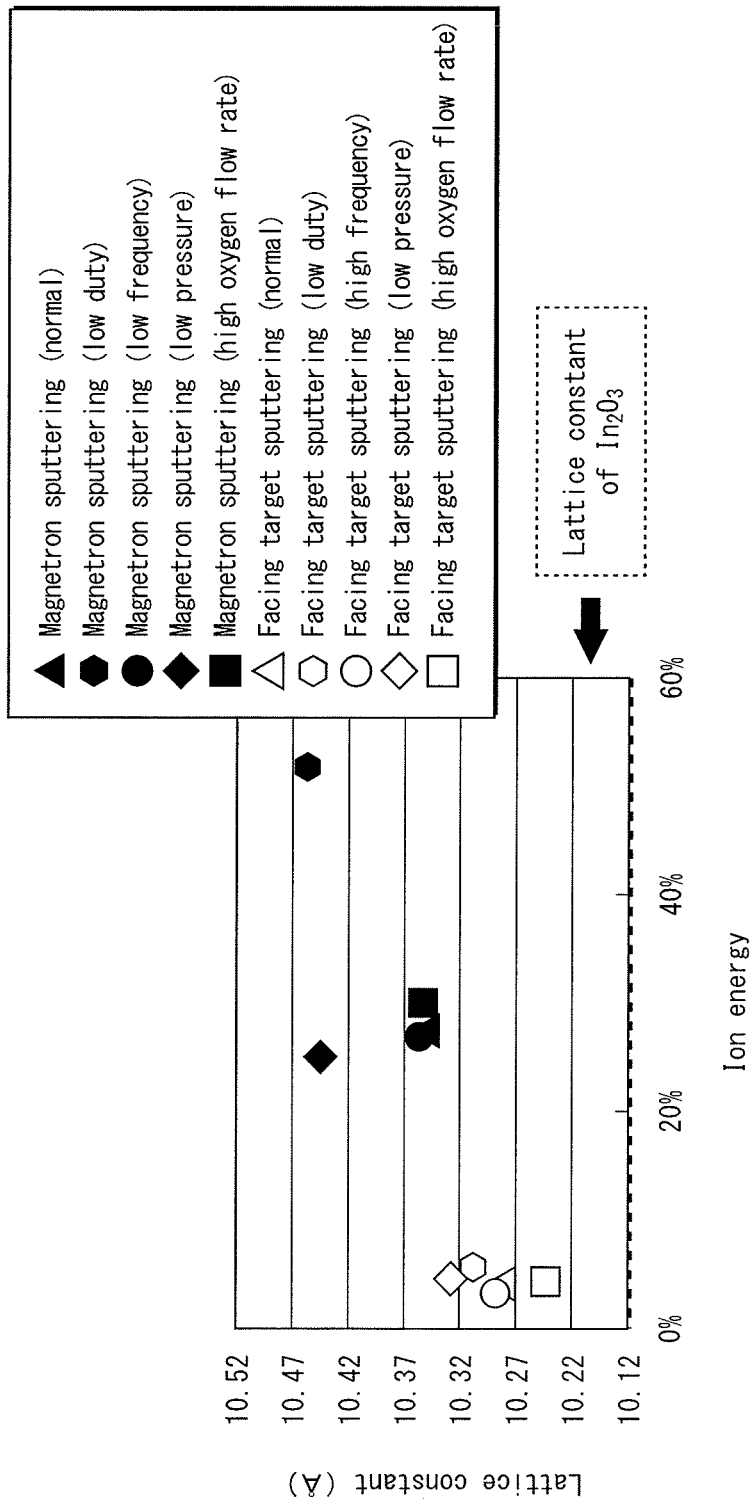
FIG. 13 shows measurements of the lattice constants of crystals of ITO films.

FIG. 13 shows measurements of the lattice constants of crystals of ITO films. Here, ITO films were formed by the same sputtering methods under the same film-forming conditions shown in FIG. 9, and the lattice constants were calculated from the peak position of the (222) diffraction line. An expression used to calculate the lattice constants is as follows.

$$a = d\sqrt{h^2 + k^2 + l^2} \quad \text{[Math 2]}$$

In the above expression, a denotes a lattice constant, d denotes spacing in the Bragg's law, and h, k and/are the Miller indices.

As shown in FIG. 13, comparing with the lattice constant 10.118 Å of In$_2$O$_3$ (ITO), the lattice constants are large in the ITO films formed by the magnetron sputtering method and the facing target sputtering method, and the distortion of crystals of ITO films formed by the sputtering methods was observed. It is clear from this result that the distortion of crystals of the ITO films formed by the magnetron sputtering method is greater than that of the ITO films formed by the facing target sputtering method. It is thought that this results from the fact that an amount of Ar ions entering the film-forming substrate is greater in the case of the magnetron sputtering method.

From results of the aforementioned experiments, the inventor thought that an organic EL element having excellent characteristics in terms of the driving efficiency and the life span can be manufactured by forming the electrode film on the organic functional layers by the magnetron sputtering method in which sputtering gas ions entering the film-forming substrate have greater energy than those in the facing target sputtering method, through a high energy process, so as to increase adhesion between the electrode layer and the organic functional layers.

That is, in the manufacturing method of the organic EL element pertaining to the present embodiment, the upper electrode is formed on the organic functional layers by the magnetron sputtering method with the film-forming power density no less than 4.5 W/cm$^2$ and no greater than 9.0 W/cm$^2$.

Note that the atmospheric gas pressure when forming the upper electrode is preferably no less than 0.4 Pa from a perspective of production time in the manufacturing method of the organic EL element, and is preferably no greater than 1.6 Pa from a perspective from the sheet resistance of the electrode layer. When the atmospheric gas pressure is too high, the sheet resistance of the electrode layer increases.

According to the result of the experiment shown in FIG. 9, the ion current density per unit dynamic rate when forming the upper electrode is preferably no less than 0.2 mA/cm$^2$ and no greater than 0.4 mA/cm$^2$.

In order to confirm the usefulness of the manufacturing method of the organic EL element pertaining to the present embodiment, the driving efficiency and the life span of the organic EL element manufactured by forming the electrode by the magnetron sputtering method through a high energy process were measured.

Figure 14:
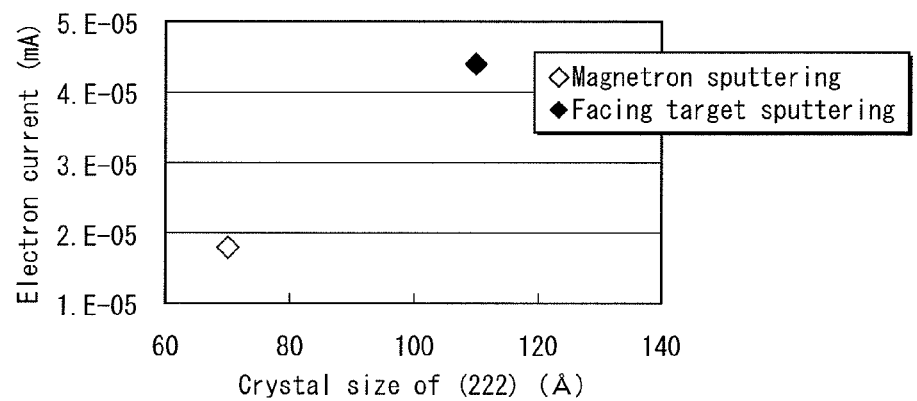
FIG. 14 shows values of currents that flow when a voltage of 5 V is applied to organic EL elements.

FIG. 14 shows values of currents that flow when a voltage of 5 V is applied to the organic EL elements. Each organic EL element was manufactured by forming ITO electrodes on the organic functional layers by the magnetron sputtering method or the facing target sputtering method. Further, the ITO electrodes were formed by the magnetron sputtering method or the facing target sputtering method under the normal film-forming condition shown in Table 3. That is, the film-forming power density of the magnetron sputtering method is 9.0 W/cm$^2$.

As shown in FIG. 14, when the same voltage is applied to the organic EL elements, larger current flows through the organic EL element whose ITO film has been formed on the organic functional layers by the magnetron sputtering method through a high energy process. Therefore, it is clear that the organic EL element with the electrode layer formed on the organic functional layers by the magnetron sputtering method through a high energy process exhibits high electron injection performance from the electrode layer to the organic functional layers, and has satisfactory driving efficiency.

Figure 15:
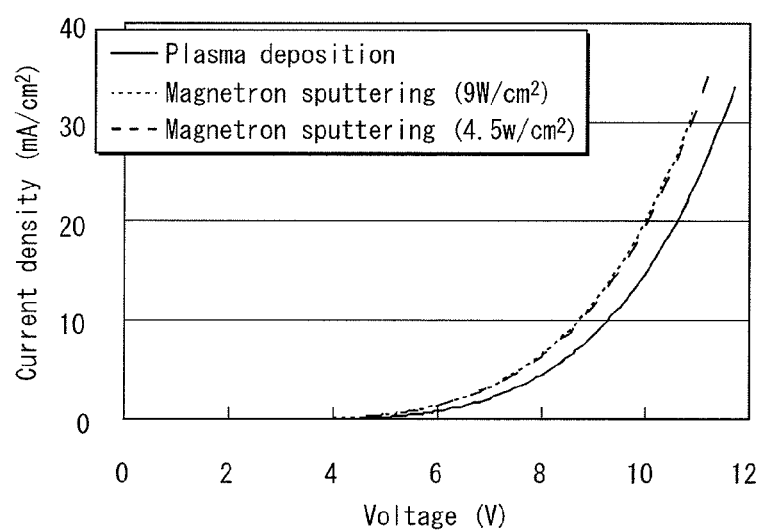
FIG. 15 shows voltage-current density characteristics of organic EL elements.

FIG. 15 shows voltage-current density characteristics of the organic EL elements. The organic EL elements are manufactured by forming the ITO film on the organic functional layers by the plasma gun deposition method, the magnetron sputtering method with the film-forming power density of 9.0 W/cm$^2$, or the magnetron sputtering method with the film-forming power density of 4.5 W/cm$^2$. By the plasma gun deposition method and the magnetron sputtering method with the film-forming power density of 9.0 W/cm$^2$, the ITO films are formed under the normal film-forming condition shown in Table 1. By the magnetron sputtering method with the film-forming power density of 4.5 W/cm$^2$, the ITO film is formed under the normal film-forming condition shown in Table 1 with the film-forming power reduced to the half.

As shown in FIG. 15, it is clear that the organic EL element manufactured by forming the ITO film on the organic functional layers by the magnetron sputtering method with the film-forming power density of 9.0 W/cm$^2$ and the organic EL element manufactured by forming the ITO film on the organic functional layers by the magnetron sputtering method with the film-forming power density of 4.5 W/cm$^2$ exhibit higher electron injection performance from the electrode to the organic functional layers, and have a more satisfactory driving efficiency than the organic EL element manufactured by forming the ITO film on the organic functional layers by the plasma gun deposition method, which is generally considered to cause low damage.

According to the result of this experiment, the magnetron sputtering method used during the forming process of the electrode on the organic functional layers in the manufacturing method of the organic EL element pertaining to the present embodiment preferably has the film-forming power density no less than 4.5 W/cm$^2$ and no greater than 9.0 W/cm$^2$.

Figure 16:
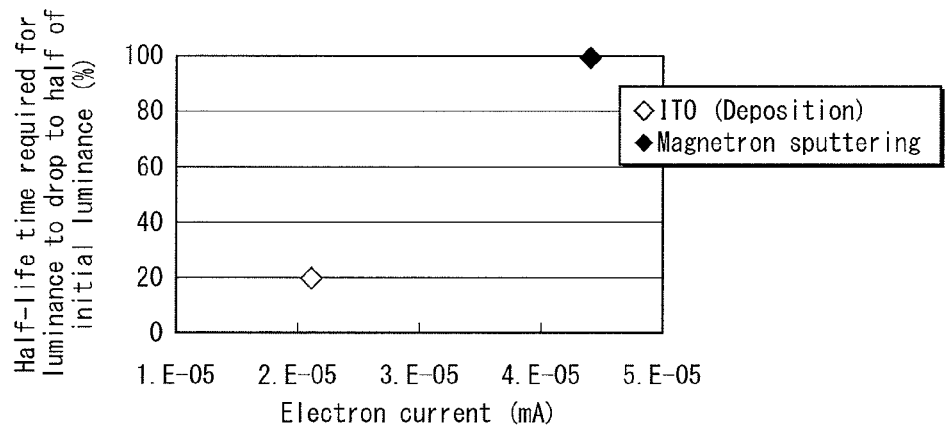
FIG. 16 shows measurements of the half-life time required for luminance of organic EL elements manufactured by forming ITO films on organic functional layers by a plasma gun deposition method or the magnetron sputtering method to drop to half of its initial luminance.

FIG. 16 shows measurements of the half-life time required for luminance of the organic EL elements manufactured by forming the ITO film on organic functional layers by a plasma gun deposition method or the magnetron sputtering method to drop to half of its initial luminance. The half-life time represented by the vertical axis is standardized by the half-life time of an organic EL element manufactured by forming an ITO film on the organic functional layers by the magnetron sputtering method. The plasma gun deposition and the magnetron sputtering method are used under the normal film-forming condition shown in Table 1. That is, the film-forming power density of the magnetron sputtering method is 9.0 W/cm$^2$.

As shown in FIG. 16, it is clear that the organic EL element manufactured by forming the ITO film on the organic functional layers by the magnetron sputtering method with the film-forming power density of 9.0 W/cm$^2$ has longer life than the organic EL element manufactured by forming the ITO film on the organic functional layers by the plasma gun deposition method, which is generally considered to cause low damage.

Figure 17:
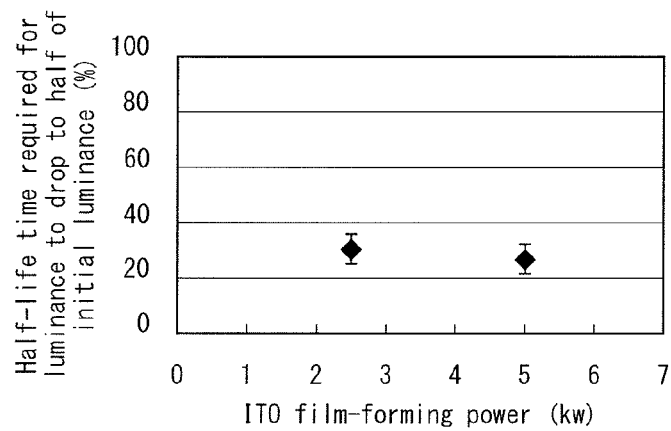
FIG. 17 shows measurements of the half-life time required for luminance of an organic EL element manufactured by forming an ITO film on organic functional layers by the facing target sputtering method to drop to half of its initial luminance.

FIG. 17 shows measurements of the half-life time required for luminance of an organic EL element manufactured by forming an ITO film on organic functional layers by the facing target sputtering method to drop to half of its initial luminance. The half-life time is standardized by the half-life time of an organic EL element manufactured by forming an ITO film on the organic functional layers by the magnetron sputtering method with the film-forming power density of 9.0 W/cm$^2$ shown in FIG. 16. As shown in FIG. 17, it is clear that even if the film-forming power increases, the half-life time of the organic EL element manufactured by forming the ITO film by the facing target sputtering method is not improved. The reason is assumed to be that in the case of the facing target sputtering method, an amount of ions entering the film-foaming substrate is not large and it is impossible to increase adhesion between the organic functional layers and the electrode layer, and that therefore electron injection performance from the electrode to the organic functional layers is not improved.

Figure 18:
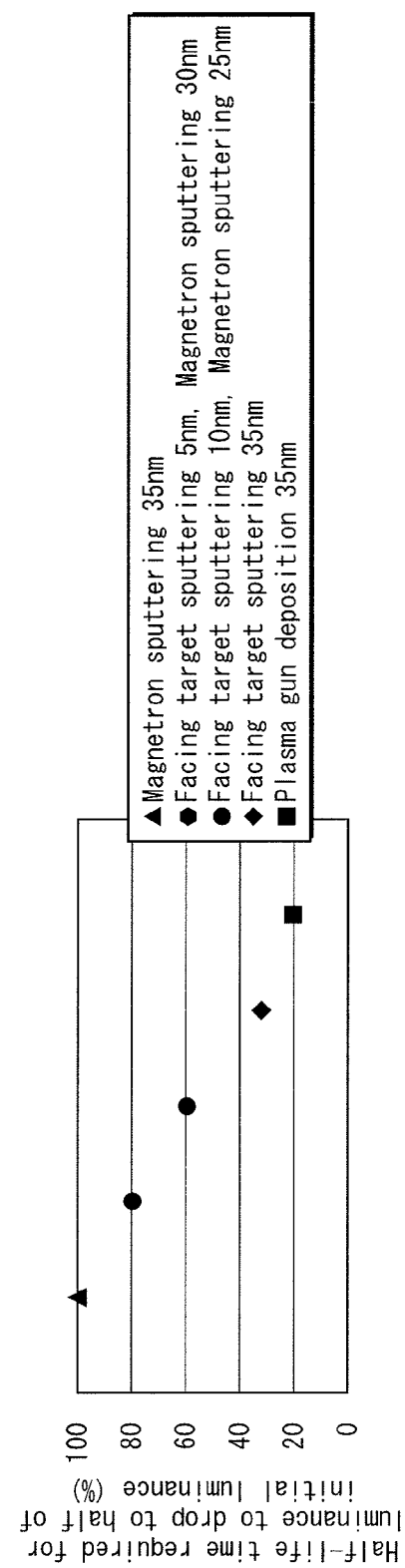
FIG. 18 shows measurements of the half-life time required for luminance of organic EL elements manufactured by forming ITO films on organic functional layers by the magnetron sputtering method, the facing target sputtering method, or the plasma gun deposition method to drop to half of its initial luminance.

FIG. 18 shows measurements of the half-life time required for luminance of organic EL elements manufactured by forming the ITO film on organic functional layers by the magnetron sputtering method, the facing target sputtering method, or the plasma gun deposition method to drop to half of its initial luminance. The half-life time represented by the vertical axis is standardized by the half-life time of luminance of an organic EL element manufactured by forming an ITO film of 35 nm by the magnetron sputtering method on the organic functional layers.

Samples are (1) an organic EL element having an ITO film of 35 nm formed on the organic functional layers by the magnetron sputtering method, (2) an organic EL element having one ITO film of 5 nm formed on the organic functional layers by the facing target sputtering method, and another ITO film of 30 nm formed on the one ITO film by the magnetron sputtering method, (3) an organic EL element having one ITO film of 10 nm formed on the organic functional layers by the facing target sputtering method, and another ITO film of 25 nm formed on the one ITO film by the magnetron sputtering method, (4) an organic EL element having an ITO film of 35 nm formed on the organic functional layers by the facing target sputtering method, and (5) an organic element having an ITO film of 35 nm formed on the organic functional layers by the plasma gun deposition method.

Further, the ITO films were formed by the magnetron sputtering method, the facing target sputtering method, or the plasma gun deposition method under the normal film-forming condition shown in Table 1. That is, the film-forming power density of the magnetron sputtering method is 9.0 W/cm$^2$.

As shown in FIG. 18, it is clear that the organic EL element having the electrode formed on the organic functional layers by the magnetron sputtering method with the film-forming power density of 9.0 W/cm$^2$ has better lifetime characteristics than those of the organic EL element having the electrode formed on the organic functional layers by the plasma gun deposition method or the facing target sputtering method.

The reason is assumed to be that since the upper electrode is formed by the magnetron sputtering method in which a large amount of ions enter the organic functional layers, through a high energy process, this increases adhesion between the organic functional layers and the upper electrode.

Although forming the upper electrode by the high energy process causes damage to the organic functional layers as the underlayer, the influence of decrease in injection barrier of electrons due to higher adhesion between the organic functional layers and the upper electrode is greater than increase in injection barrier of electrons due to the damage to the organic functional layers during the forming process of the upper electrode. Therefore, it is possible to manufacture the organic EL element with high electron injection performance from the upper electrode to the organic functional layers, high efficiency and a longer life span.

It is clear that the organic EL element having one electrode formed on the organic functional layers by the facing target sputtering method and another electrode formed on the one electrode by the magnetron sputtering method with the film-forming power density of 9.0 W/cm$^2$ has better lifetime characteristics than those of the organic EL element having an electrode formed on the organic functional layers by only the plasma gun deposition method or the facing target sputtering method.

This result indicates that an organic EL element having excellent lifetime characteristics can be manufactured by using the magnetron sputtering method with high energy in the process of forming the upper electrode.

As shown in FIG. 15, the organic EL element manufactured by forming the ITO film on the organic functional layers by the magnetron sputtering method with the film-forming power density of 9.0 W/cm$^2$ and the organic EL element manufactured by forming the ITO film on the organic functional layers by the magnetron sputtering method with the film-fattening power density of 4.5 W/cm$^2$ exhibit substantially the same electron injection performance from the electrode to the organic functional layers. Therefore, it can be thought that the organic EL element manufactured by forming the ITO film on the organic functional layers by the magnetron sputtering method with the film-forming power density of 4.5 W/cm$^2$ has excellent lifetime characteristics like the organic EL element manufactured by forming the ITO film on the organic functional layers by the magnetron sputtering method with the film-forming power density of 9.0 W/cm$^2$.

To summarize the above, in the manufacturing method of the organic EL element pertaining to the present embodiment, the electrode is formed by the magnetron sputtering method in which a large amount of ions enter the substrate in a sputtering gas, through a high energy process, and this increases adhesion between the organic functional layers and the electrode. Therefore, it is possible to manufacture the organic EL element with high electron injection performance from the upper electrode to the organic functional layers, high efficiency and a longer life span.

[Supplement]

While the present invention has been described according to the above embodiment, the present invention is in no way limited to the embodiment. The present invention also includes cases such as the following.

(1) In the above embodiment, the organic EL element includes the cathode, the electron transport layer, the light-emitting layer, the hole transport layer, the hole injection layer, the anode and the substrate. However, the present invention is not limited to this. The organic EL element has only to include a pair of electrodes composed of a cathode and an anode, and organic functional layers disposed between the cathode and the anode. The organic functional layers may include functional layers that have not described here. Also, the organic functional layers may not include part of the functional layers described here.

(2) In the above embodiment, the electrode is formed of ITO by the magnetron sputtering method, for example. However, the present invention is not limited to this. A transparent conductive material such as IZO may be used, and other electrode materials may be used.

INDUSTRIAL APPLICABILITY

The method of manufacturing the organic EL element according to the present invention makes it possible to manufacture an organic EL element with high efficiency and a longer life span, and is useful.

REFERENCE SIGNS LIST 100 organic EL element
101 cathode
102 electron transport layer
103 light-emitting layer
104 hole transport layer
105 hole injection layer
106 anode
107 substrate
300 magnetron sputtering device
301 sputtering chamber
302 gas supply system
303 exhaust system
304 backing plate
305 target
306 magnet
307 mount
308 film-forming substrate
309 power source

The invention claimed is:

1. A method of manufacturing an organic EL element having a pair of electrodes and an organic functional layer disposed therebetween, the pair of electrodes consisting of an upper electrode and a lower electrode, comprising:
    forming the upper electrode on the organic functional layer by a magnetron sputtering method with a film-forming power density no less than 4.5 W/cm$^2$ and no greater than 9.0W/cm$^2$,
    wherein the organic functional layer includes an electron transport layer,
    the upper electrode directly contacts the electron transport layer, and
    an ion current density per unit dynamic rate during the formation of the upper electrode is no less than 0.2 mA/cm$^2$ and no greater than 0.4 mA/cm$^2$.

2. The method of claim 1,
    wherein an atmospheric gas pressure during the formation of the upper electrode is no less than 0.4 Pa and no greater than 1.6 Pa.

3. The method of claim 1,
    wherein the upper electrode is formed of transparent conductive material.

4. The method of claim 1, wherein the upper electrode is formed of indium tin oxide.

5. The method of claim 1,
    wherein the upper electrode is a cathode, and
    the lower electrode is an anode.

6. The method of claim 5,
    wherein the organic functional layer is composed of a plurality of layers including an electron transport layer, and
    the cathode is formed on the electron transport layer.

7. The method of claim 1,
    wherein the electron transport layer is not a composite electron injecting and electron transport layer.

* * * * *